US005801405A

United States Patent [19]
Nakayama et al.

[11] Patent Number: 5,801,405
[45] Date of Patent: Sep. 1, 1998

[54] FIELD EFFECT TRANSISTOR

[75] Inventors: Tatsuo Nakayama; Hironobu Miyamoto, both of Tokyo, Japan

[73] Assignee: NEC Corporation, Tokyo, Japan

[21] Appl. No.: 923,067

[22] Filed: Sep. 3, 1997

Related U.S. Application Data

[63] Continuation of Ser. No. 575,079, Dec. 19, 1995, abandoned.

[30] Foreign Application Priority Data

Dec. 21, 1994 [JP] Japan ............... 6-335835

[51] Int. Cl.$^6$ ............... H01L 31/0328; H01L 31/0336; H01L 31/072; H01L 31/109
[52] U.S. Cl. ............... 257/192; 257/20; 257/24
[58] Field of Search ............... 257/18, 192, 194, 257/20, 24, 27, 190, 191, 279, 280, 286

[56] References Cited

U.S. PATENT DOCUMENTS

| | | | |
|---|---|---|---|
| 4,984,242 | 1/1991 | Scifres et al. | 257/18 |
| 5,331,410 | 7/1994 | Kuwata | 257/194 |
| 5,371,387 | 12/1994 | Ando | 257/192 |
| 5,373,168 | 12/1994 | Ando et al. | 257/24 |
| 5,436,470 | 7/1995 | Nakajima | 257/20 |
| 5,449,928 | 9/1995 | Matsugatani et al. | 257/194 |
| 5,453,631 | 9/1995 | Onda et al. | 257/192 |

FOREIGN PATENT DOCUMENTS 5-036726  2/1993  Japan.

OTHER PUBLICATIONS

"Improved InAlAs/InGaAs HEMT Characteristics by Inserting an InAs Layer into the InGaAs Channel," by T. Akazaki et al., IEEE Electron Device Letters, vol. 13, No. 6, Jun. 1992, pp. 325–327.

*Primary Examiner*—Mahshid D. Saadat
*Assistant Examiner*—S. V. Clark
*Attorney, Agent, or Firm*—Foley, Hoag & Eliot LLP

[57] ABSTRACT

An active layer of a field effect transistor disposed on an InP substrate (101) comprises at least an InAs layer (105) and two InGaAs layers (104, 106). The InGaAs layer (104) is $In_xGa_{1-x}As$ (wherein $0.55<x<1$) and the InGaAs layer (106) is $In_yGa_{1-y}As$ (wherein $0.55<y<1$). The active layer comprises, for example, $In_{0.53}Ga_{0.47}As$ layer (103)/ $In_{0.8}Ga_{0.2}As$ layer (104)/InAs layer (105)/$In_{0.8}Ga_{0.2}As$ layer (106)/$In_{0.53}Ga_{0.47}As$ layer (107). Electrons which have been leached out of the InAs layer (105) are confined into the InGaAs layers (104, 106), and about 90% of the active electrons are accumulated in the layers (104, 105, 106) to achieve an excellent electron transport performance, so that an excellent high frequency characteristic can be obtained exhibiting a high cut-off frequency and an improved transconductance.

20 Claims, 3 Drawing Sheets

FIELD EFFECT TRANSISTOR

This application is a continuation of application Ser. No. 08/575,079, filed Dec. 19, 1995, now abandoned.

FIELD OF THE INVENTION

The present invention relates to a field effect transistor and, in particular, to a field effect transistor excellent in high frequency characteristic so as to exhibit a high cut-off frequency and an improved transconductance.

BACKGROUND OF THE INVENTION

Conventionally, in an InAlAs/InGaAs field effect transistor provided on an InP substrate, in order to improve its high frequency characteristic, a structure in which InAs composition ratio of the active layer is increased has been used. As a typical example thereof, there is a structure using an InAs layer in the active layer. This structure was reported in, for example, IEEE ELECTRON DEVICE LETTERS, VOL. 13, NO. 6, JUNE 1992, PP. 325-327, by Tatsushi Akazaki et al.

FIG. 1 illustrates a cross-sectional view of the structure of the field effect transistor which is shown in the foregoing document. As shown in FIG. 1, an InAlAs buffer layer 202 is formed on an InP (100) substrate 201. On the buffer layer 202, an active layer or channel layer is formed. The active layer comprises an InGaAs layer 203 having the InAs composition ratio of 0.53, an InAs layer 204 and an InGaAs layer 205 having the InAs composition ratio of 0.53. On the active layer, an InAlAs spacer layer 206, an n-InAlAs electron supply layer 207, InAlAs schottky layer 208, an n-InAlAs cap layer 209 and an n-InGaAs cap layer 210 are formed. Incidentally, in FIG. 1, reference numeral 211 denotes a source electrode, 212 a gate electrode and 213 a drain electrode.

In this structure, more electrons can be confined than with the structure comprising only the InGaAs layer having the InAs composition ratio of 0.53 as the active layer because a conduction band discontinuity between the InAlAs layer and the InAs layer is larger than that between the InAlAs layer and the InGaAs layer having the InAs composition ratio of 0.53.

Further, the InAs layer can transport electrons faster than the InGaAs layer with the InAs composition ratio of 0.53. As a consequence, this structure exhibit a higher cut-off frequency and higher transconductance than the structure utilizing only the InGaAs layer having the InAs composition ratio of 0.53 for the active layer, so that the high frequency characteristic of the transistor is improved.

However, in the foregoing conventional technique, with the increase of the InAs composition ratio in the active layer, lattice mismatching with the InP substrate becomes large and the critical layer thickness becomes small, it is necessary to thin the thickness of the active layer having a higher InAs composition ratio in order to maintain excellent crystallinity.

In particular, when the InAs layer is used for the active layer, it is necessary to thin the thickness of the InAs layer down to, for example, about 4 nm. If, as in this conventional example, the about 4 nm thick InAs layer is used for the active layer, electrons are leached out of or seep from the InAs layer into the InGaAs layers, and only about 50% of the electrons are accumulated within the InAs layer, of which an excellent electron transport characteristic can be expected. Since the electrons which have been leached out exist in the InGaAs layer with the InAs composition ratio of 0.53 which is far inferior to InAs layer in electron transport performance, the excellent electron transport performance which the InAs layer has is difficult to be reflected on the transistor characteristic, and the improvement of the cut-off frequency and the transconductance is also small.

SUMMARY OF THE INVENTION

Accordingly, an object of the present invention is to remove the above-mentioned conventional defects and to provide a field effect transistor excellent in high frequency characteristic showing a far higher cut-off frequency and transconductance than that of the conventional technique.

In order to achieve the foregoing object, the present invention provides a field effect transistor disposed on a substrate, comprising:

a carrier supply layer; and an active layer, the active layer comprising at least an InAs layer and a first InGaAs layer and a second InGaAs layer positioned so as to put the InAs layer therebetween, the first InGaAs layer being positioned at a substrate side and having a composition represented by a formula $In_xGa_{1-x}As$ (wherein $0.55<x<1$), the second InGaAs layer having a composition represented by a formula $In_yGa_{1-y}As$ (wherein $0.55<y<1$).

In an aspect of the present invention, inequalities $0.65<x<0.85$ and $0.65<y<0.85$ subsist.

In another aspect of the present invention, the active layer further comprises a third InGaAs layer positioned at the substrate side of the first InGaAs layer, and a fourth InGaAs layer positioned at an anti-substrate side of the second InGaAs layer, the third InGaAs layer having a composition represented by a formula $In_aGa_{1-a}As$ (wherein $a<x$), the second InGaAs layer having a composition represented by a formula $In_bGa_{1-b}As$ (wherein $b<y$).

In the other aspect of the present invention, inequalities $0.50<a<0.55$ and $0.50<b<0.55$ subsist.

In the other aspect of the present invention, a thickness of the InAs layer is more than 1 nm and less than 10 nm.

In the other aspect of the present invention, a thickness of the first InGaAs layer is more than 2 nm and less than 6 nm.

In the other aspect of the present invention, a thickness of the second InGaAs layer is more than 1 nm and less than 4 nm.

In the other aspect of the present invention, a buffer layer is positioned between the substrate and the active layer.

In the other aspect of the present invention, the buffer layer is made of InAlAs.

In the other aspect of the present invention, the carrier supply layer is positioned at the anti-substrate side of the active layer.

In the other aspect of the present invention, the carrier supply layer is made of impurity-doped InAlAs.

In the other aspect of the present invention, a spacer layer is positioned between the active layer and the carrier supply layer.

In the other aspect of the present invention, the spacer layer is made of InAlAs.

In the other aspect of the present invention, a schottky layer is positioned at the anti-substrate side of the carrier supply layer.

In the other aspect of the present invention, the schottky layer is made of InAlAs.

In the other aspect of the present invention, a source electrode, gate electrode and a drain electrode are positioned at the anti-substrate side of the schottky layer.

In the other aspect of the present invention, the substrate is made of InP.

In the present invention, the active layer includes an $In_xGa_{1-x}As$ (wherein $0.55<x<1$)/InAs/$In_yGa_{1-y}As$ (wherein $0.55<y<1$) structure. The $In_xGa_{1-x}As$ (wherein $0.55<x<1$) layer and the $In_yGa_{1-y}As$ (wherein $0.55<y<1$) layer less in strain than the InAs layer are each inserted between the InAs layer high in strain and the InGaAs layer with the InAs composition ratio of 0.53 which is lattice matched to the InP substrate, so that the heterointerface between the adjacent layers can be smoothly formed. By the smooth heterointerface being formed, the degradation of the electron transport performance, which is caused by scattering due to the heterointerface roughness, can be suppressed.

Further, since the $In_xGa_{1-x}As$ (wherein $0.55<x<1$) layer and the $In_yGa_{1-y}As$ (wherein $0.55<y<1$) layer are positioned adjacent to the InAs layer, which InGaAs layers have conduction band energy more separated from that of the InAlAs layer as compared with the InGaAs layer, which is lattice matched to the InP substrate, the electrons which are leached out of the InAs layer are confined into the above $In_xGa_{1-x}As$ (wherein $0.55<x<1$) layer and the $In_yGa_{1-y}As$ (wherein $0.55<y<1$) layer.

Further, in the present invention, the electrons which are leached out of the InAs layer are confined into the above $In_xGa_{1-x}As$ (wherein $0.55<x<1$) layer and the $In_yGa_{1-y}As$ (wherein $0.55<y<1$) layer, which InGaAs layers are superior in electron transport performance to the InGaAs layer having the InAs composition ratio of 0.53 which is lattice matched to the InP substrate.

In consequence, by using the structure of the present invention, a field effect transistor excellent in high frequency characteristic which exhibits a high cut-off frequency and an improved transconductance can be realized.

DESCRIPTION OF THE PREFERRED EMBODIMENTS

Next, specific embodiments of the present invention will be described with reference to the accompanying drawings.

Figure 2:
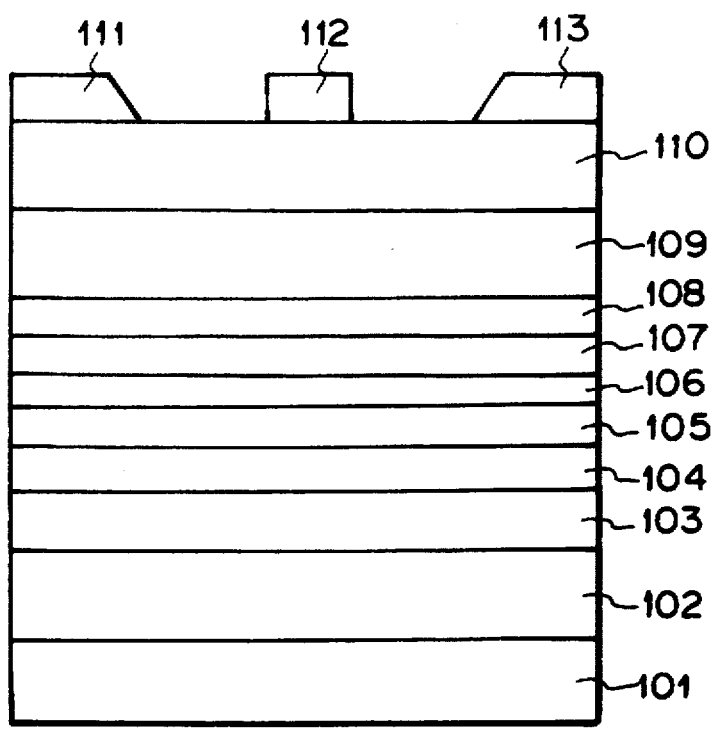
FIG. 2 is a cross-sectional view illustrating an embodiment of the field effect transistor according to the present invention.
Figure 3:
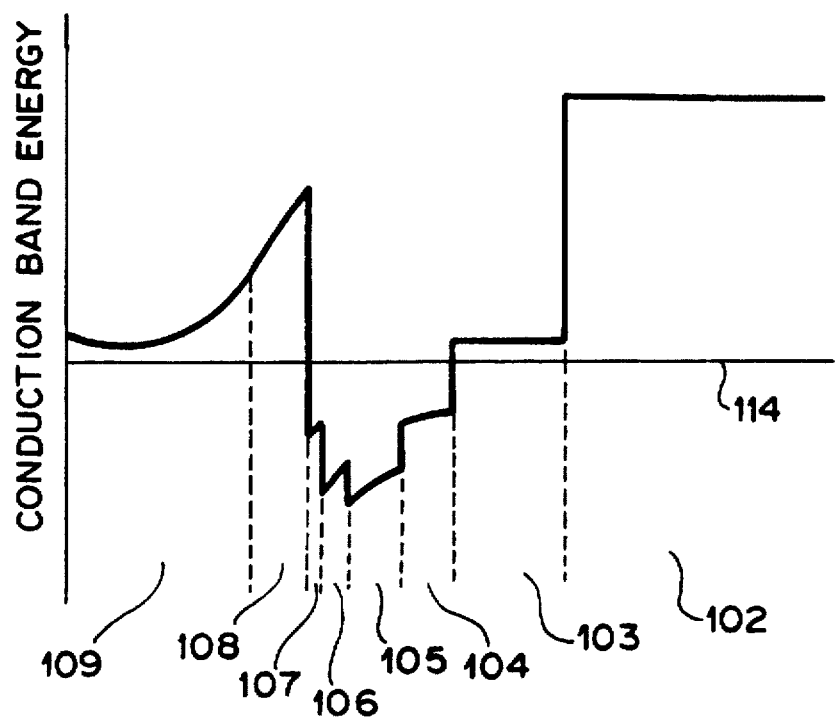
FIG. 3 is a diagram showing an energy band structure of the embodiment of FIG. 2 for illustrating the change of the conduction band in the active layer and the neighborhood thereof.

FIG. 2 is a cross-sectional view illustrating an embodiment of the field effect transistor according to the present invention, and FIG. 3 is a diagram showing an energy band structure of the embodiment of FIG. 2 for illustrating the change of the conduction band in the neighborhood of the active layer.

The field effect transistor illustrated in FIG. 2 are manufactured by the following steps: growing an InAlAs buffer layer 102 (for example, InAs composition ratio of 0.52, thickness of 200 nm) on an InP substrate 101; growing an InGaAs layer 103 (for example, InAs composition ratio of 0.53, thickness of 9 nm), an InGaAs layer 104 (for example, InAs composition ratio of 0.8, thickness of 4 nm), an InAs layer 105 (for example, thickness of 4 nm), an InGaAs layer 106 (for example, InAs composition ratio of 0.8, thickness of 2 nm) and an InGaAs layer 107 (for example, InAs composition ratio of 0.53, thickness of 1 nm) sequentially; growing an InAlAs spacer layer 108 (for example, InAs composition ratio of 0.52, thickness of 4 nm), an InAlAs carrier supply layer 109 (for example, InAs composition ratio of 0.52, thickness of 20 nm) and an InAlAs schottky layer 110 (for example, InAs composition ratio of 0.52, thickness of 20 nm) sequentially; and, forming a source electrode 111, a gate electrode 112 and a drain electrode 113 thereon. In the InAlAs carrier supply layer 109, Si is doped with the concentration of, for example, $3 \times 10^{18}$ $cm^{-3}$. The active layer or channel layer comprises the above InGaAs layer 103, InGaAs layer 104, InAs layer 105, InGaAs layer 106 and the InGaAs layer 107.

In FIG. 3 showing the energy band structure, especially the change of the conduction band in the neighborhood of the InGaAs layers, the abscissa is the position along the direction of the thickness of each layer of the structure shown in FIG. 2, and the ordinate is the energy of the lower edge of the conduction band. This FIG. 3 reveals that the conduction band of the $In_{0.8}Ga_{0.2}As$ layer 104, InAs layer 105 and $In_{0.8}Ga_{0.2}As$ layer 106 is lower than Fermi level 114 and that they can confine electrons with a far higher probability than the layer higher in conduction band than Fermi level, for example, $In_{0.53}Ga_{0.47}As$ layer 103, which reveals that most of the electrons within the active layer can be confined into the high InAs composition ratio layers 104, 105, 106 of which a high electron transport performance can be expected.

Figure 1:
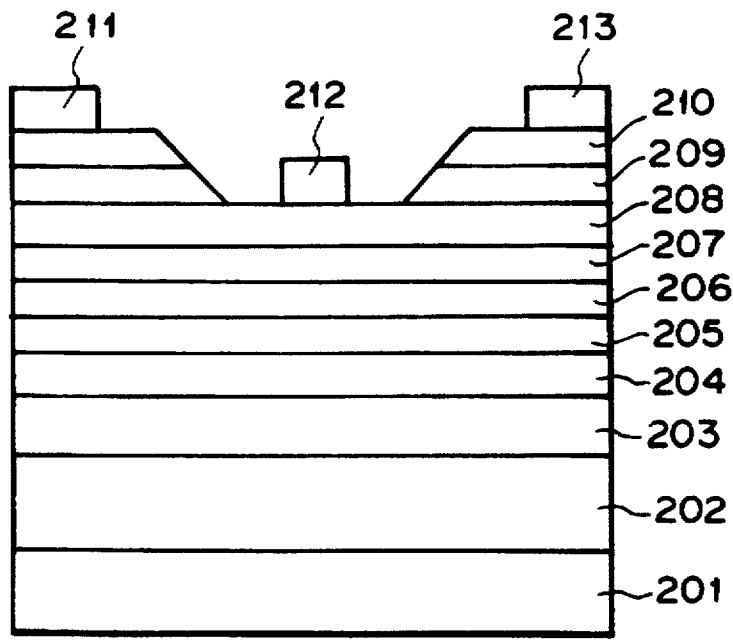
FIG. 1 is a cross-sectional view illustrating a conventional field effect transistor.

By adopting such a structure, since about 90% of the electrons are confined into the high InAs composition ratio layers, i.e. InGaAs layer 104 (InAs composition ratio of 0.8, thickness of 4 nm)/InAs layer 105 (thickness of 4 nm)/InGaAs layer 106 (InAs composition ratio of 0.8, thickness of 2 nm), of the active layer, a field effect transistor excellent in high frequency characteristic in which a high electron transport characteristic inherent to the high InAs ratio layers is reflected and which exhibits a high cut-off frequency and high transconductance can be obtained. It was found that the above embodiment realized the cut-off frequency of 260 GHz by using a 1.5 μm long gate electrode and the electron mobility higher by 14% than that of the structure of FIG. 1.

Incidentally, although, in the foregoing embodiment, as the high InAs ratio layers of the active layer was chosen the InGaAs layer 104 (InAs composition ratio of 0.8, thickness of 4 nm)/InAs layer 105 (thickness of 4 nm)/InGaAs layer 106 (InAs composition ratio of 0.8, thickness of 2 nm), the InAs composition ratio for the InGaAs layers 104 and 106 can be each changed within the range of 0.55 to 1.

That is, in the field effect transistor, if the active layer comprises two InGaAs layers and an InAs layer inserted between them, and the InAs composition ratio of the InGaAs layers is chosen to be $In_xGa_{1-x}As$ (wherein $0.55<x<1$) and $In_yGa_{1-y}As$ (wherein $0.55<y<1$), the electrons which have been leached out of the InAs layer are confined into the high InAs ratio layers excellent in electron transport performance so as to exhibit a high cut-off frequency and an improved transconductance.

However, if the InAs composition ratio is near to 0.55 or 1, the difference between the strain energies in the heterointerface tends to become large and the heterointerface tends to be roughened to exert an undesired influence on the electron transport performance. Therefore, the InAs composition ratio of the InGaAs layer contacting the InAs layer is preferably within the range of 0.65 to 0.85.

Although, in the foregoing embodiment, the thickness of the InAs layer 105 was set to 4 nm, the thickness of the InAs layer 105 may be set to any arbitrary value as long as the dislocation is not generated and the desired high frequency characteristic can be obtained. It is, for example, within the range of 1 nm to 10 nm.

Although, in the foregoing embodiment, the thickness of the InGaAs layer 104 was set to 4 nm, the thickness of the InGaAs layer 104 may be set to any arbitrary value as long as the dislocation is not generated. However, as the thickness of the InGaAs layer 104 increases, the strain energy of the high InAs ratio layers as a whole increases and the degradation of crystallinity caused by dislocation occurs. Therefore, it is preferably within the range of 2 nm to 6 nm.

Similarly, although, in the foregoing embodiment, the thickness of the InGaAs layer 106 was set to 2 nm, the thickness of the InGaAs layer 106 may be changed within the range of 1 nm to 6 nm. However, as the thickness of the InGaAs layer 106 increases, the distribution of the electrons becomes more distant from the gate electrode and the improvement in the high frequency characteristic is suppressed. Therefore, it is preferably within the range of 1 nm to 4 nm.

Figure 4:
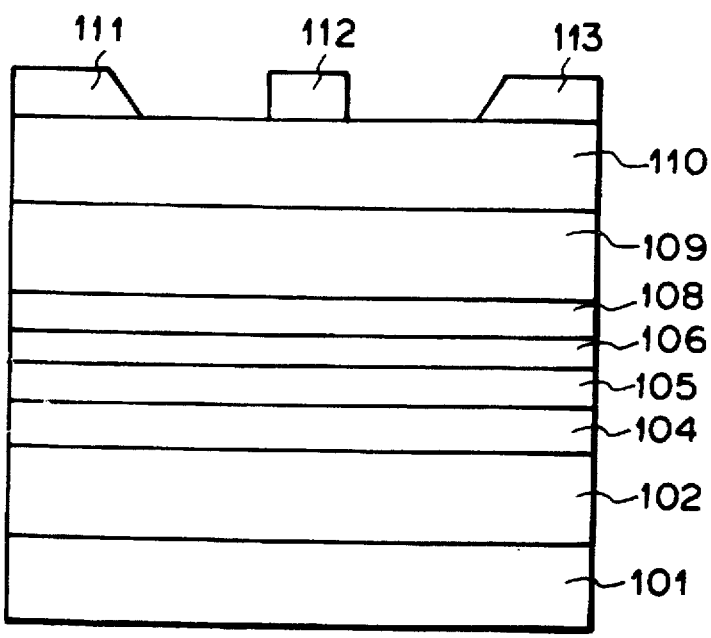
FIG. 4 is a cross-sectional view illustrating another embodiment of the field effect transistor according to the present invention.
Figure 5:
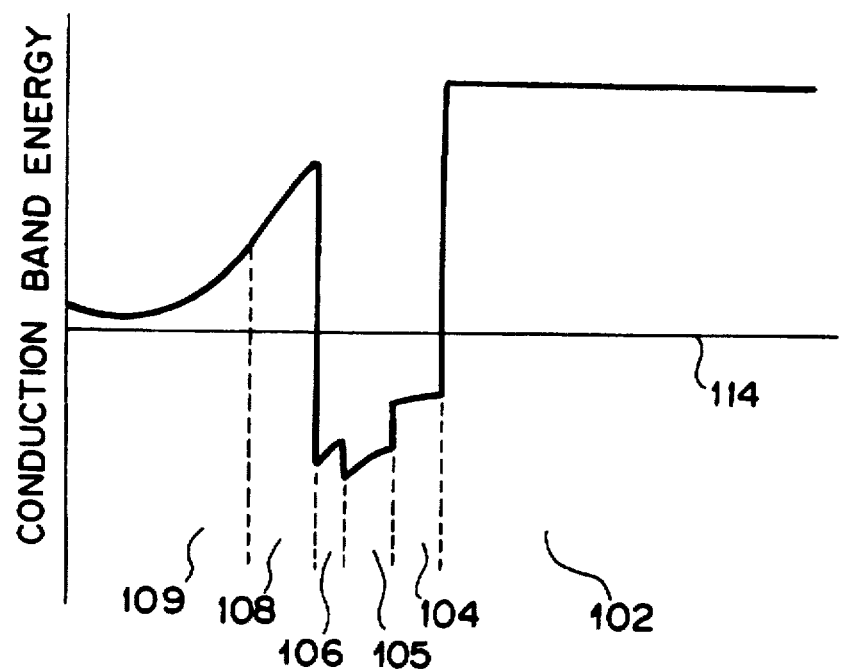
FIG. 5 is a diagram showing an energy band structure of the embodiment of FIG. 4 for illustrating the change of the conduction band in the active layer and the neighborhood thereof.

In the foregoing embodiment, the active layer comprises the InGaAs layer 103 (InAs composition ratio of 0.53, thickness of 9 nm) and the InGaAs layer 107 (InAs composition ratio of 0.53, thickness of 1 nm) in addition to the InAs layer 105 and InGaAs layers 104, 106. However, the InGaAs layers 103, 107 may be omitted. FIG. 4 is a cross-sectional view illustrating such an embodiment of the field effect transistor according to the present invention. FIG. 5 is a diagram showing an energy band structure of the embodiment of FIG. 4. It was found that this embodiment, achieved the similar effect as the embodiment of FIG. 2.

Further, the InAs composition ratio of each of InAlAs buffer layer 102, InAlAs spacer layer 108, InAlAs carrier supply layer 109 and InAlAs schottky layer 110 may be each changed within the range of 0 to 1. Still further, these layers may be made of GaAs, AlGaAs, AlAs, InP or AlSb.

Further, the concentration of the dopant in the InAlAs carrier supply layer 109 may be set to any desired value. With reference to the dopant, in the foregoing embodiment, since electron was chosen as the carrier, the n-type dopant Si was used. However, the other n-type dopant such as S or Se may be used. If hole is chosen as the carrier, a p-type dopant such as Be, C or the like may be used.

As described in the above, according to the present invention, the field effect transistor features that the active layer includes the $In_xGa_{1-x}As$ (wherein 0.55<x<1)/InAs/$In_yGa_{1-y}As$ (wherein 0.55<y<1) structure, and most of electrons can be accumulated within the InAs layer and the InGaAs layers with the InAs composition ratio of above 0.55 having a high electron transport performance, so that an excellent high frequency characteristic can be obtained to achieve a high cut-off frequency and high transconductance.

What is claimed is:

1. A field effect transistor disposed on a substrate, comprising:

a carrier supply layer; and an active layer, positioned between said substrate and said carrier supply layer, said active layer comprising a first InGaAs layer, a second InGaAs layer, and an InAs layer positioned therebetween having a thickness of more than 1 nm and less than 10 nm, said first InGaAs layer being positioned closer to said substrate than said InAs layer and having a thickness of more than 2 nm and less than 6 nm and a composition represented by a formula $In_xGa_{1-x}As$ (wherein 0.55<x<1), said second InGaAs layer being positioned farther away from said substrate than said InAs layer and having a thickness of more than 1 nm and less than 4 nm and a composition represented by a formula $In_yGa_{1-y}As$ (wherein 0.55<y<1).

2. The field effect transistor as set forth in claim 1, wherein 0.65<x<0.85 and 0.65<y<0.85.

3. The field effect transistor as set forth in claim 1, wherein said active layer further comprises a third InGaAs layer positioned closer to said substrate than said first InGaAs layer, and a fourth InGaAs layer positioned farther away from said substrate than said second InGaAs layer, said third InGaAs layer having a composition represented by a formula $In_aGa_{1-a}As$ (wherein a<x), said fourth InGaAs layer having a composition represented by a formula $In_bGa_{1-b}As$ (wherein b<y).

4. The field effect transistor as set forth in claim 3, wherein 0.50<a<0.55 and 0.50<b<0.55.

5. The field effect transistor as set forth in claim 1, wherein in a buffer layer is positioned between the substrate and the active layer.

6. The field effect transistor as set forth in claim 5, wherein said buffer layer is made of InAlAs.

7. The field effect transistor as set forth in claim 1, wherein said carrier supply layer is made of impurity-doped InAlAs.

8. The field effect transistor as set forth in claim 1, wherein a spacer layer is positioned between the active layer and the carrier supply layer.

9. The field effect transistor as set forth in claim 8, wherein said spacer layer is made of InAlAs.

10. The field effect transistor as set forth in claim 1, wherein a schottky layer positioned at a side of the carrier supply layer farthest away from said substrate.

11. The field effect transistor as set forth in claim 10, wherein said schottky layer is made of InAlAs.

12. The field effect transistor as set forth in claim 10, wherein a source electrode, gate electrode and a drain electrode are positioned at a side of the schottky layer farthest away from said substrate.

13. The field effect transistor as set forth in claim 1, wherein said substrate is made InP.

14. A field effect transistor disposed on a substrate, comprising:

a carrier supply layer; and an active layer, positioned between said substrate and said carrier supply layer, said active layer comprising a first InGaAs layer, a second InGaAs layer, and an InAs layer positioned therebetween, said first InGaAs layer being positioned closer to said substrate than said InAs layer and having a thickness of more than 2 nm and less than 6 nm and a composition represented by a formula $In_xGa_{1-x}As$ (wherein 0.55<x<1), said second InGaAs layer being positioned farther away from said substrate than said InAs layer and having a composition represented by a formula $In_yGa_{1-y}As$ (wherein 0.55<y<1).

15. The field effect transistor as set forth in claim 14, wherein said active layer further comprises a third InGaAs layer positioned closer to said substrate than said first InGaAs layer, and a fourth InGaAs layer positioned farther away from said substrate than said second InGaAs layer, said third InGaAs layer having a composition represented by a formula $In_aGa_{1-a}As$ (wherein a<x), said fourth InGaAs layer having a composition represented by a formula $In_bG_{1-b}As$ (wherein b<y).

16. The field effect transistor as set forth in claim 15, wherein 0.50<a<0.55 and 0.50<b<0.55.

17. The field effect transistor as set forth in claim 14, wherein said second InGaAs layer has a thickness of more than 1 nm and less than 4 nm.

18. A field effect transistor disposed on a substrate, comprising:

a carrier supply layer; and an active layer, positioned between said substrate and said carrier supply layer, said active layer comprising a first InGaAs layer, a second InGaAs layer, and an InAs layer positioned therebetween, said first InGaAs layer being positioned closer to said substrate than said InAs layer and having a composition represented by a formula $In_xGa_{1-x}As$ (wherein 0.55<x<1), said second InGaAs layer being positioned farther away from said substrate than said InAs layer and having a thickness of more than 1 nm and less than 4 nm and a composition represented by a formula $In_yGa_{1-y}As$ (wherein 0.55<y<1).

19. The field effect transistor as set forth in claim 18, wherein said active layer further comprises a third InGaAs layer positioned closer to said substrate than said first InGaAs layer, and a fourth InGaAs layer positioned farther away from said substrate than said second InGaAs layer, said third InGaAs layer having a composition represented by a formula $In_aGa_{1-a}As$ (wherein a<x), said fourth InGaAs layer having a composition represented by a formula $In_bGa_{1-b}As$ (wherein b<y).

20. The field effect transistor as set forth in claim 19, wherein 0.50<a<0.55 and 0.50<b<0.55.

* * * * *